United States Patent [19]
Wong et al.

[11] Patent Number: 5,477,177
[45] Date of Patent: Dec. 19, 1995

[54] PHASE ERROR PROCESSOR CIRCUIT WITH A COMPARATOR INPUT SWAPPING TECHNIQUE

[75] Inventors: Hee Wong, San Jose; Gabriel M. Li, San Francisco, both of Calif.

[73] Assignee: National Semiconductor Corporation, Santa Clara, Calif.

[21] Appl. No.: 371,013

[22] Filed: Jan. 11, 1995

[51] Int. Cl.⁶ .............................. H03L 7/08; H03D 3/20
[52] U.S. Cl. .............................. 327/156; 327/3; 331/17; 375/375
[58] Field of Search .................... 327/2, 3, 12, 40, 327/43, 63, 64, 65, 147, 156, 159; 331/17, 1 A, 25; 375/373, 375, 376

[56] References Cited

U.S. PATENT DOCUMENTS

| | | | |
|---|---|---|---|
| 4,083,015 | 4/1978 | Popodi | 331/4 |
| 4,084,133 | 4/1978 | Zimmer et al. | 327/3 |
| 4,215,430 | 7/1980 | Johnson, Jr. | 375/376 |
| 5,012,494 | 4/1991 | Lai et al. | 375/376 |
| 5,197,086 | 3/1993 | Jackson et al. | 375/373 |
| 5,239,561 | 8/1993 | Wong et al. | 375/81 |
| 5,319,680 | 6/1994 | Port et al. | 375/375 |
| 5,337,335 | 8/1994 | Cloetens et al. | 375/376 |

Primary Examiner—Timothy P. Callahan
Assistant Examiner—My. Trang Nu Ton
Attorney, Agent, or Firm—Limbach & Limbach

[57] ABSTRACT

A phase-locked loop having a phase error processor (PEP) circuit in which a phase error is provided to the PEP circuit in the form of a first pulse stream comprising pulses of a width dictated by the phase error between the incoming data and a local clock and a second pulse stream comprising pulses of a reference width. The circuit includes two integrators having outputs coupled to first and second inputs of a comparator, respectively. Switches couple the first pulse stream to the input of one integrator and the second pulse stream to the input of the other integrator during a first time window and reverse the connections during a second time window. The switches are controlled by a SWAP signal which alternates state at regular intervals. The output of the comparator is exclusive-ORed with the SWAP signal in order to invert the comparator output signal every other window so as to average any input offset error of the comparator or offset due to mismatch of the integrators evenly between the two pulse streams. The output of the exclusive-OR gate is coupled to the input of a D flip flop which is latched once per window. The output of the D flip flop is an UP/$\overline{\text{DOWN}}$ signal which controls an oscillator, which generates the local clock signal, to advance or retard the phase of the local clock in response to the condition of the UP/$\overline{\text{DOWN}}$ signal.

27 Claims, 5 Drawing Sheets

PHASE ERROR PROCESSOR CIRCUIT WITH A COMPARATOR INPUT SWAPPING TECHNIQUE

FIELD OF THE INVENTION

The invention pertains to a phase error processor in a phase-locked loop which functions as an interface between a proportionate phase detector and a digitally controlled oscillator.

BACKGROUND OF THE INVENTION

Phase-locked loops (PLLs) are frequently used to synchronize a local clock of a digital device which receives data over a communication channel to the frequency and phase of the received digital data. One type of PLL utilizes a two-state quantized phase detector. In such a PLL, a serial logic representation of the leading and lagging phase errors provides a simple and low cost interface between the two-state quantized phase detector and a digitally controlled oscillator. The two logic states of the serial interface cause the output phase of the digitally controlled oscillator to advance or retard in response to the sign of the phase error.

In many high-speed data communication systems, such as the Fiber Distribution Data Interface (FDDI), duty-cycle distortions and data-pattern dependent jitters can be severe. In such systems, proportionate phase detectors, rather than two-state quantized state detectors, are commonly employed. Proportionate phase detectors, however, may use long digital words, which are costly to process. Accordingly, there is a need to embed proportionate phase error information in serial logic signals so as to insure that duty-cycle distortions and data-pattern dependent jitters can be kept within reasonable limits, and to allow implementation of the PLL using digital logic circuitry.

A prior art technique that might be adapted to achieve this goal is the use of a proportionate phase detector followed by a charge pump and a comparator. However, designing charge pumps for operation at high frequencies such as 100 megahertz and above is difficult. Charge pumps designed for operation at such high frequencies commonly suffer from performance problems such as dead band problems. Further, the P-channel and N-channel transistors of the complementary current sources used in such charge pumps are difficult to match, resulting in degradation of the PLL's dynamic tracking performance and causing static alignment errors (SAEs).

U.S. Pat. No. 5,239,561 discloses a phase error processor which substantially overcomes some of these problems. That patent discloses a phase error processor (PEP) which interfaces a proportionate phase detector to a digital loop filter in a high frequency PLL. The PLL receives a high frequency stream of NRZI encoded data. The data is received at a variable density of data signal transitions. A phase detector in the PLL generates proportionate phase error information in the form of a phase error signal PD1 and a reference signal PD2. PD1 is a pulse signal with a pulse width, TW1, that corresponds to the phase error between the data signal transition and the local PLL clock. PD2 is a pulse signal with a fixed width, TW2, equal to half of the period of the local PLL clock.

The PEP disclosed in that patent defines a window of N local clock cycles, where N is an integer. The PEP separately integrates the proportionate phase error pulses from just one pair of adjacent positive and negative data transitions on each of PD1 and PD2 during each window, if the number of input data transitions which occur during that window exceeds an expected minimum. Otherwise, the PEP passes no phase error information. The selection of window width (i.e., the value of N) is selected relative to the coding scheme of the incoming data stream to assure that the window is wide enough such that there will be at least two pulses per window under normal conditions. The integrated information on each signal, PD1 and PD2, is converted by the phase error processor once during each window into a single bit UP/$\overline{\text{DOWN}}$ signal which is provided to a digitally controlled oscillator (DCO) through a digital loop filter. The DCO, which is generating the local clock signal, advances or retards the phase of the local PLL clock depending on the condition of the UP/$\overline{\text{DOWN}}$ signal.

In particular, the PEP disclosed in U.S. Pat. No. 5,239,561 includes first and second integrator circuits for integrating the PB1 and PB2 signals, respectively. The outputs of the two integrators are coupled to the separate inputs of a comparator. The output of the comparator is coupled to the input of a D flip flop, which latches the comparator output signal once for each window. The output of the D flip flop is the UP/$\overline{\text{DOWN}}$ signal. The control of the DCO by the UP/$\overline{\text{DOWN}}$ signal should cause the clock output of the DCO to approach the frequency of the incoming data stream.

However, mismatch between the components of the two integrators (e.g., resistors and capacitors) causes a static alignment error (or SAE) between the local clock output by the DCO and the frequency of the incoming data stream. Further, any offset between the inputs of the comparator causes additional static alignment error.

Accordingly, it is an object of the present invention to provide an improved phase error processor for a PLL.

It is another object of the present invention to provide a phase error processor employing a comparator input swapping technique.

It is a further object of the present invention to provide a phase-error processor for a PLL in which mismatch of integrator componentry does not result in a static alignment error.

It is yet one more object of the present invention to provide a phase error processor for a PLL in which input offset of the comparator does not cause a static alignment error.

SUMMARY OF THE INVENTION

The present invention is a phase-locked loop having a proportionate phase-error processor (PEP) employing a switching technique to reduce or eliminate static alignment error. The PEP of the present invention separately integrates a PD1 signal, which represents a phase error between the PLL local clock and the incoming data, and a PD2 reference signal, which is equivalent to what the PD1 signal is when there is no phase error and compares the two integrated signals in a comparator. Using the switching technique of the present invention, any static offset between the two integrators of the PEP and any input offset error of the comparator in the PEP equivalently affects both the PD1 signal and the PD2 signal, thereby eliminating any static alignment error caused by such offsets.

In particular, a proportionate phase detector receives a stream of incoming data at a first input and the PLL local clock signal at a second input and outputs two signals, termed PD1 and PD2, to a phase-error processor. PD1 is a stream of pulses in which the width of the pulses is dictated by the phase error between the incoming data stream and the PLL local clock. The PD2 signal is a stream of pulses of a predetermined fixed width, the fixed width being the expected width of pulses on line PD1 when the phase error between the local clock signal and the incoming data stream is zero. Thus, when the pulses on PD1 and PD2 have the same width, there is no phase error between the incoming data and the local clock. However, when the width of the pulses on PD1 is greater than the width of the reference pulses on PD2, there is a phase error in a first direction, e.g., leading, and when the width of the pulses on PD1 is less than the width of the reference pulses on PD2, there is a phase error in the opposite direction, e.g., lagging.

The phase error processor has a first integrator coupled to receive the PD1 signal and a second integrator coupled to receive the PD2 signal. The output of the first integrator is coupled to the first input of a comparator, while the output of the second integrator is coupled to the second input of the comparator. The comparator outputs a signal of a first value (e.g., logic high) when the output of the first integrator is greater than the output of the second integrator and outputs a signal of a second value (e.g., logic low) when the output of the first integrator is less than the output of the second integrator.

The apparatus further comprises a finite state machine and first and second switches coupled to an output signal line, SWAP, of the finite state machine. The two switches are controlled by the SWAP signal in unison. Particularly, when the SWAP signal is in a first state, the PD1 signal is coupled through the first switch to the input of the first integrator and the PD2 signal is coupled through the second switch to the input of the second integrator. When the SWAP signal is in a second state, the PD1 signal is coupled through the second switch to the second integrator and the PD2 signal is coupled through the first switch to the first integrator.

The finite state machine, under the timing control of the PLL local clock, causes the SWAP signal to be switched between the first and second conditions at regular intervals. In this manner, any componentry mismatch between the two integrators and any input offset of the comparator equally affects both the PD1 and PD2 signals so as not to result in any static alignment error in the output of the phase error processor. Since the swapping of PD1 and PD2 causes the polarity of the comparator output to switch every time the SWAP signal is switched, the output of the comparator is exclusive-OR with the SWAP signal before it is provided to the input of a D flip flop (the output of which is the UP/$\overline{\text{DOWN}}$ signal provided to the DCO). Accordingly, the exclusive-OR gate inverts the output of the comparator every other time the SWAP signal is switched such that the polarity of the UP/$\overline{\text{DOWN}}$ signal does not change.

DETAILED DESCRIPTION OF THE INVENTION

Figure 1:
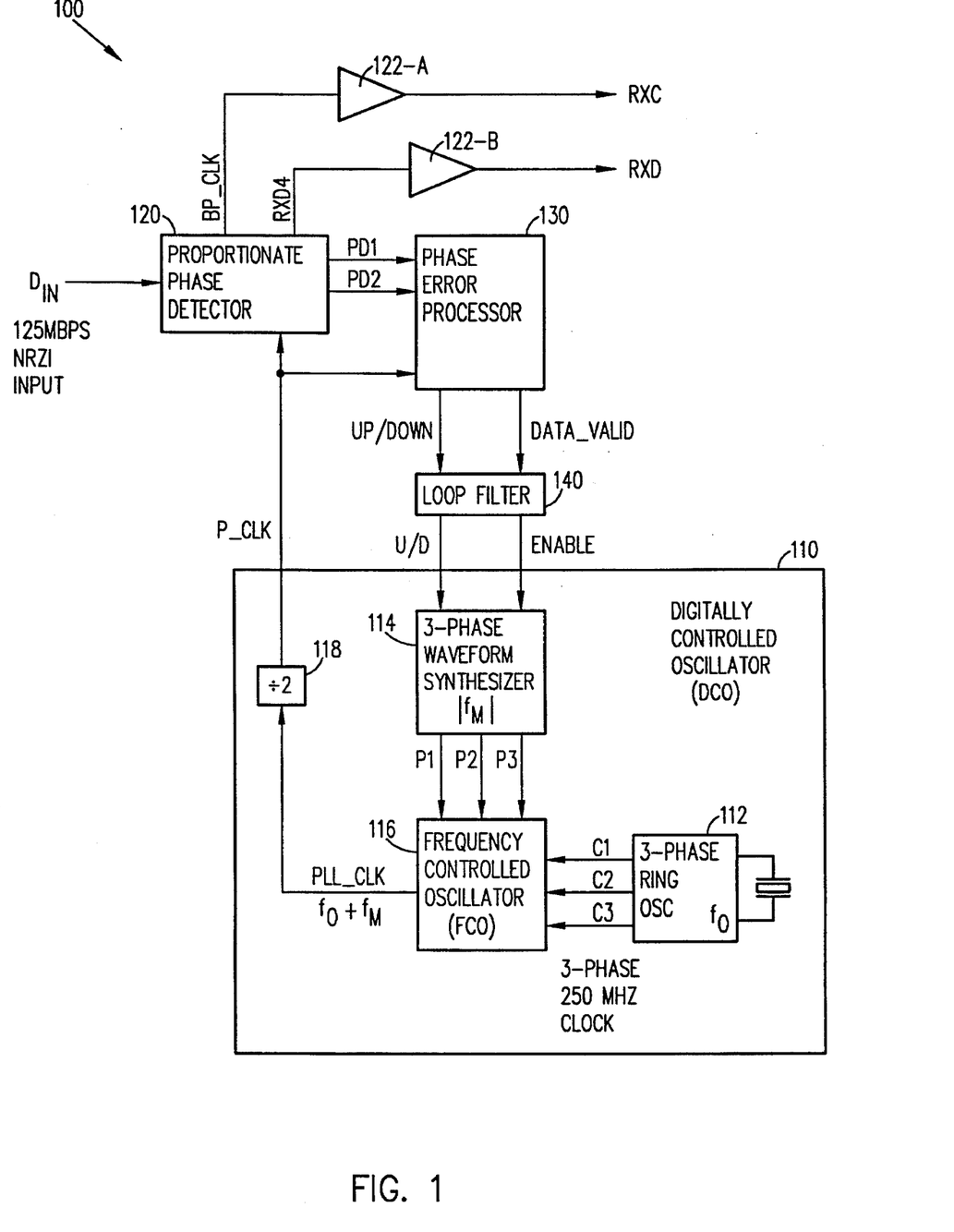
FIG. 1 is a block diagram of a phase-locked loop in accordance with the present invention.

FIG. 1 is a block diagram of a phase-locked loop in accordance with the present invention. Phase-locked loops (PLLs) such as PLL 100 in FIG. 1 are used in many applications including, but not limited to, use for synchronizing the clock of a digital device which is receiving data over a communication channel to the frequency and phase of the incoming data stream. Accordingly, the purpose of exemplary PLL 100 in FIG. 1 is to generate a periodic clock signal P-CLK which matches the frequency and phase of an incoming data stream, $D_{in}$.

In a preferred embodiment, the data signal $D_{in}$ is an NRZI coded data signal transmitted at a rate of 125 megabits per second. The local clock, P-CLK, is generated by a digitally controlled oscillator (DCO) 110. A proportionate phase detector 120 is coupled to receive the incoming data stream $D_{in}$ as well as the local clock signal, P-CLK. The proportionate phase detector 120 generates two signals, PD1 and PD2, responsive to the input signals P-CLK and $D_{in}$. Particularly, for every edge transition in $D_{in}$, phase detector 120 generates pulses on signal lines PD1 and PD2. The pulse width of PD1, TW1, is dictated by the phase difference between $D_{in}$ and P-CLK. PD2 is a reference signal having a pulse width, TW2, which always is equal to one half of the clock period of P-CLK, which, under ideal operating conditions, is equal to the width, TW1, of the pulses of PD2 when there is no phase difference between $D_{in}$ and P-CLK. Accordingly, the difference between pulse widths TW1 and TW2 is proportional to the phase error between $D_{in}$ and P-CLK. When TW1 is shorter than TW2, it indicates that the phase error is in a first direction, e.g., the local clock phase leads the phase of the incoming data. When TW1 is greater than TW2, it indicates that the phase error is in the opposite direction, e.g., the local clock phase lags behind the phase of the incoming data.

Proportionate phase detector 120 also generates a BP-CLK and an RXD4 output signal. These are recovered clock and data signals, respectively, from the data input stream $D_{in}$. These signals are replicated as signals RXC and RXD, respectively, by buffer circuits 122-A and 122-B.

Signals PD1 and PD2 are provided to a phase error processor circuit 130 which produces two digital signals, namely, an UP/$\overline{\text{DOWN}}$ signal and a DATA-VALID signal. The two logic states of the UP/$\overline{\text{DOWN}}$ signal indicate whether the phase error between $D_{in}$ and P-CLK is a leading error or a lagging error. The logic state of the DATA-VALID signal indicates whether the UP/$\overline{\text{DOWN}}$ signal is valid.

The UP/$\overline{\text{DOWN}}$ signal and the DATA-VALID signal are filtered by a digital loop filter 140 and provided therethrough to DCO 110.

In a preferred embodiment, the DCO 110 comprises a 3-stage ring oscillator 112 that generates three equally phase spaced high frequency clock signals C1–C3 having a frequency $F_0$ of about 250 megahertz (twice the frequency of the incoming datastream, $D_{in}$). A 3-phase wave form synthesizer 114 receives at inputs thereof the filtered UP/$\overline{\text{DOWN}}$ and DATA-VALID signals. It generates therefrom three equally phase spaced low frequency control signals, P1, P2 and P3, having control frequency $F_m$, where $F_m$ corresponds to the frequency error between $D_{in}$ and $F_0$. Particularly, frequency $F_m$ is set to be approximately equal to $2F_{in} - F_0$, where $F_{in}$ is the frequency of the incoming data signal $D_{in}$.

DCO 110 further comprises a frequency controlled oscillator (FCO) 116. FCO 116 generates a clock signal PLL-CLK having a frequency of $F_0 + F_m$, where the polarity of $F_m$ is dictated by the sign of $2F_n - F_0$. A divide-by-two circuit 118 receives PLL-CLK at its input and outputs the P-CLK signal at its output. P-CLK is a square wave signal that should match the frequency $F_{in}$ (about 125 megahertz) and phase of the data input stream $D_{in}$.

Figure 2:
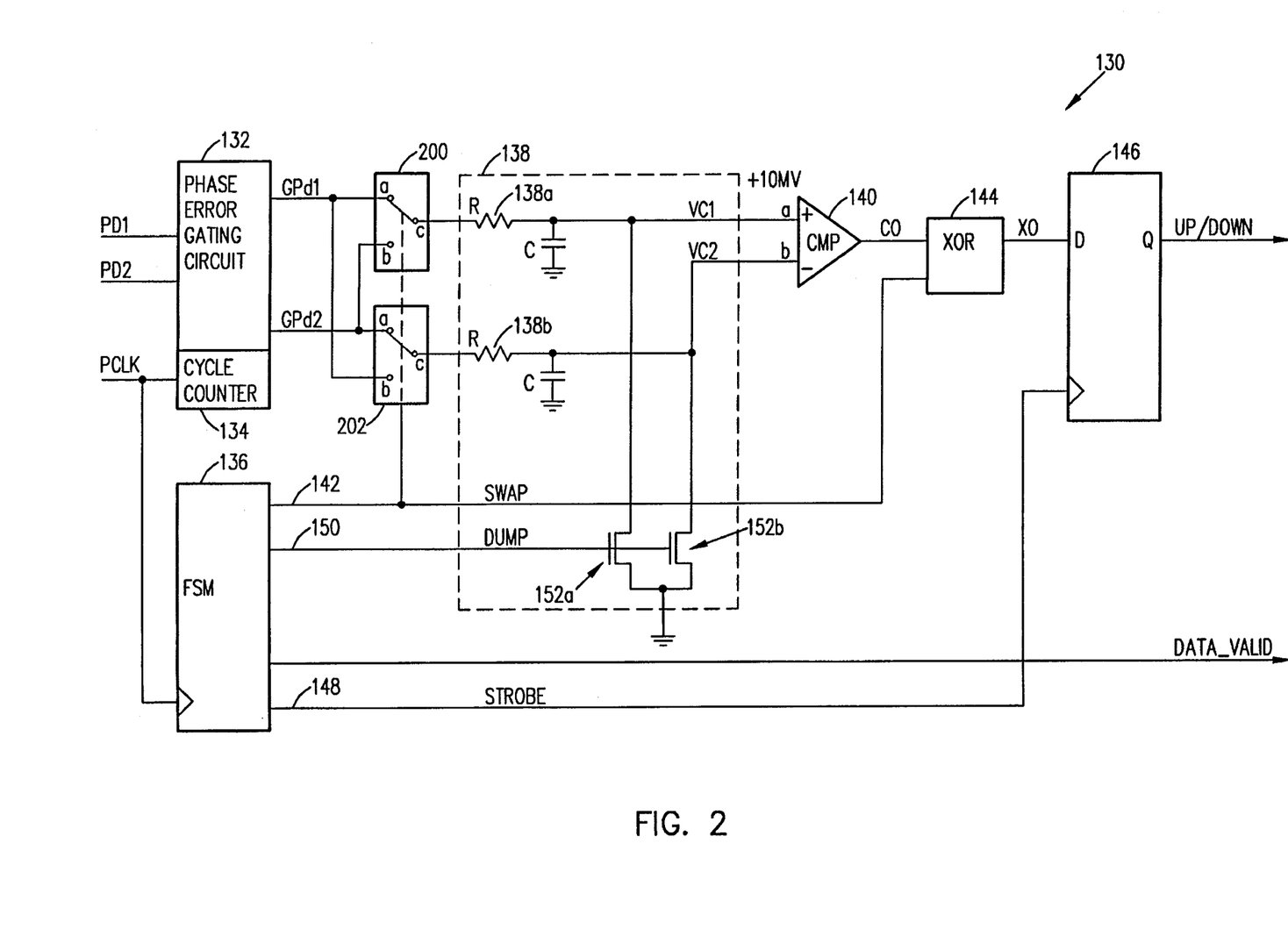
FIG. 2 is a partially block, partially schematic diagram of a phase error processor block of the circuit of FIG. 1 in accordance with the present invention.

FIG. 2 illustrates the phase error processor 120 of the present invention in greater detail. The PD1 and PD2 signals from the proportionate phase detector 120 are input to a phase error gating circuit 132. The phase error gating circuit 132 extracts two pulses from each of the P-CLK and $D_{in}$ signal lines for each window of a defined duration.

The duration of the window is selected based on the coding scheme to ensure that each of P-CLK and $D_{in}$ will have at least two pulses in the defined window width. For instance, in the FDDI system of the illustrated embodiment, using a 4B/5B coding scheme and NRZI code bits, each transmitted data symbol (encoded with five bits at a rate of approximately eight nanoseconds per bit) is guaranteed to have at least two edge transitions for clock recovery purposes. During the transmission of line state symbols, however, the density of edge transmissions may become one per clock period for Idle Line State, one per five clock periods for Halt Line State and one per ten clock periods for Master Line State. Thus, the duration between edges of the incoming bit stream can range from one to ten clock periods. However, the edge density may be even higher or lower due to transmission errors.

A window width of 44 cycles of the PLL local clock, P-CLK, ensures that there will be at least two edge transitions per window. Particularly, as previously mentioned, the lowest edge density for FDDI systems is one per ten clock periods. Accordingly, a window width of 44 cycles provides for a minimum of four input data images, including one data image used to open the gating circuit 132, allowing second and third data images to pass through the gating circuit 132, and a fourth edge to close the gating circuit 132.

Accordingly, the phase error gating circuit 132 gates the incoming pulses on PD1 and PD2 and allows only two pulses to pass through per 44 cycle window. A cycle counter 134 controls the phase error gating circuit 132 to allow only two pulses to pass through circuit 132 per each 44 cycle window. A detailed description of the phase error gating circuit 132 and cycle counter 134 is found in U.S. Pat. No. 5,239,561, which is incorporated herein by reference.

Particularly, continuous processing of phase errors from the FDDI bitstream without the above-discussed gating technique requires an extremely high speed digital loop filter circuit 140, which would be costly and complex to implement. Further, the loop frequency in such an implementation would be dependent on the incoming edge density. Thus, the PLL's loop characteristic and performance would vary with the incoming edge density. Such variability in the PLL's loop characteristics is undesirable. The use of gating reduces the required loop filter frequency and also makes the operating frequency constant.

Although not a necessity in the present invention, the gating is advantageous and preferable for several reasons. First, it significantly reduces the necessary processing frequency of the data loop filter 140. Second, it allows the use of a differential charge and dump circuit 138, instead of a high frequency charge pump circuit. Third, the edge density is constant (two edges per 44 clock cycles), thus eliminating any effect of any dependence of the loop gain on the edge density. U.S. Pat. No. 5,239,561 contains a more complete discussion of this gating technique.

The outputs of phase error gating circuit 132 are gated versions, GPD1 and GPD2, of the phase signals PD1 and PD2, respectively. GPD1 is provided to the A terminal of switch 200 and the B terminal of switch 202. GPD2 is provided to the B terminal of switch 200 and the A terminal of switch 202. Switches 200 and 202 are each two position switches. The C terminal of switches 200 and 202 are coupled to RC circuits 138A and 138B, respectively, of charge dump circuit 138. Both switches 200 and 202 are controlled by a SWAP signal generated by a finite state machine 136. In the first state, the SWAP signal controls switches 200 and 202 to select the A terminal to couple to the C terminal. In a second state, the SWAP signal controls switches 200 and 202 to select the B terminal to couple to the C terminal. Switches 200 and 202 are controlled in unison.

RC circuits 138A and 138B are integrators which integrate the PD1 and PD2 signals. The outputs of the integrating RC circuits 138A and 138B are provided to first and second inputs of a comparator 140, respectively. The integrator coupled to the signal GPD1 will output a lower voltage to comparator 140 than the integrator coupled to GPD2, if the pulse width TW1 of the GPD1 pulses is less than the pulse width TW2 of the GPD2 pulses (e.g., a leading phase error) and will generate a higher voltage output if the pulse width TW1 of the GPD1 pulses is greater than the pulse width TW2 of the GPD2 pulses (e.g., a lagging phase error).

Accordingly, for a given state of the SWAP signal, the output of comparator 140 will be in a first state, (e.g., logic high), if there is a lagging phase error and in a second state (e.g., logic low), if there is a leading phase error. As will be described in greater detail below, the UP/$\overline{\text{DOWN}}$ signal generated by phase error processor 130 is a modified version of the comparator output.

The components of integrators 138 and 138B should be matched as closely as possible in order to provide an accurate output to comparator 140. Any mismatch in the resistors and capacitors of integrators 138A and 138B will result in an offset in the comparator output. In other words, when pulse widths TW1 and TW2 are equal, the outputs of the integrators will not be equal because they are not perfectly matched. Further, any offset in the comparator with respect to its inputs will result in a further offset in the UP/$\overline{\text{DOWN}}$ output signal.

Therefore, if GPD1 is always presented to the first integrator 138A and GPD2 is always presented to the second integrator 138B then there will be a static alignment error (SAE) in the output of the comparator, and, therefore, in the UP/$\overline{\text{DOWN}}$ signal.

In order to eliminate static alignment error due to these problems, finite state machine 136 generates the SWAP signal on line 142 which is coupled to control inputs of switches 200 and 202 to switch the GPD1 and GPD2 signals between the integrators 138A and 138B regularly. Particularly, every window, the SWAP signal changes states causing switches 200 and 202 to SWAP signals GPD1 and GPD2 between the integrators 138A and 138B.

Accordingly, during a first window, signal GPD1 is integrated by integrator 138A and sent to input A of comparator 140, while signal GPD2 is integrated by integrator 138B and sent to input terminal B of comparator 140. During the following window, however, signal GPD1 is integrated by integrator 138B and sent to the B input terminal of comparator 140, while signal GPD2 is integrated by integrator 138A and sent to the A input terminal of comparator 140. Thus, any offset due to mismatch of components of the integrators and any input offset of the comparator 140 equally affects both the GPD1 and GPD2 signals, thus nulling any static alignment error due to such offsets.

However, the integrator swapping technique described above will result in a polarity change in the output of comparator 140, i.e., a given logic state of the output of comparator 140 indicates a leading error during the first window, but a lagging error during the following window. In other words, during cycles when the SWAP signal is logic high, a logic high output of comparator 140 indicates a lagging phase error, but during alternate windows, in which the SWAP signal is logic low, a logic high output from comparator 140 indicates a leading phase error.

Figure 3A:
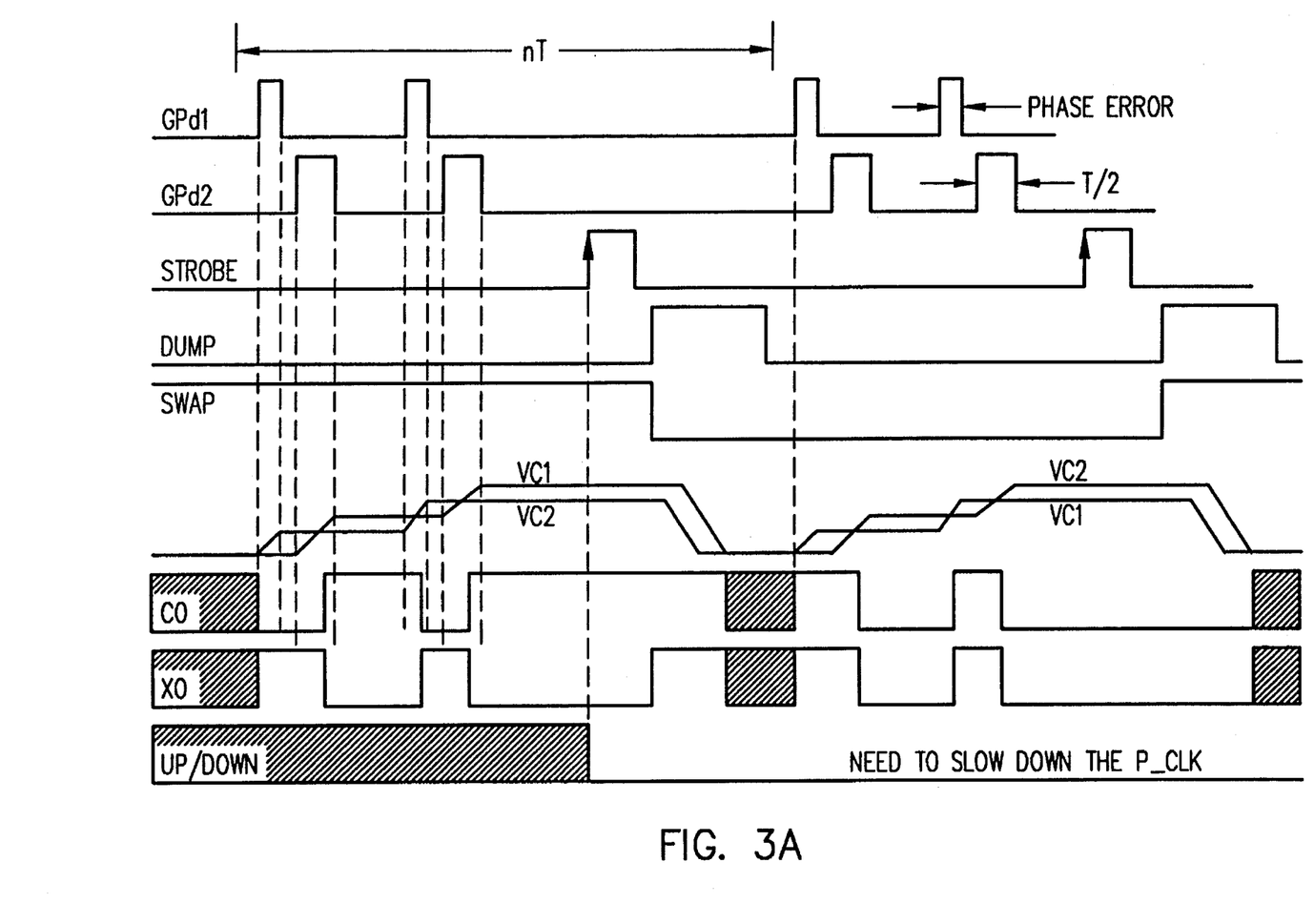
FIGS. 3A, B and C are timing diagrams for the circuit of FIG. 2 in accordance with the present invention.
Figure 3B:
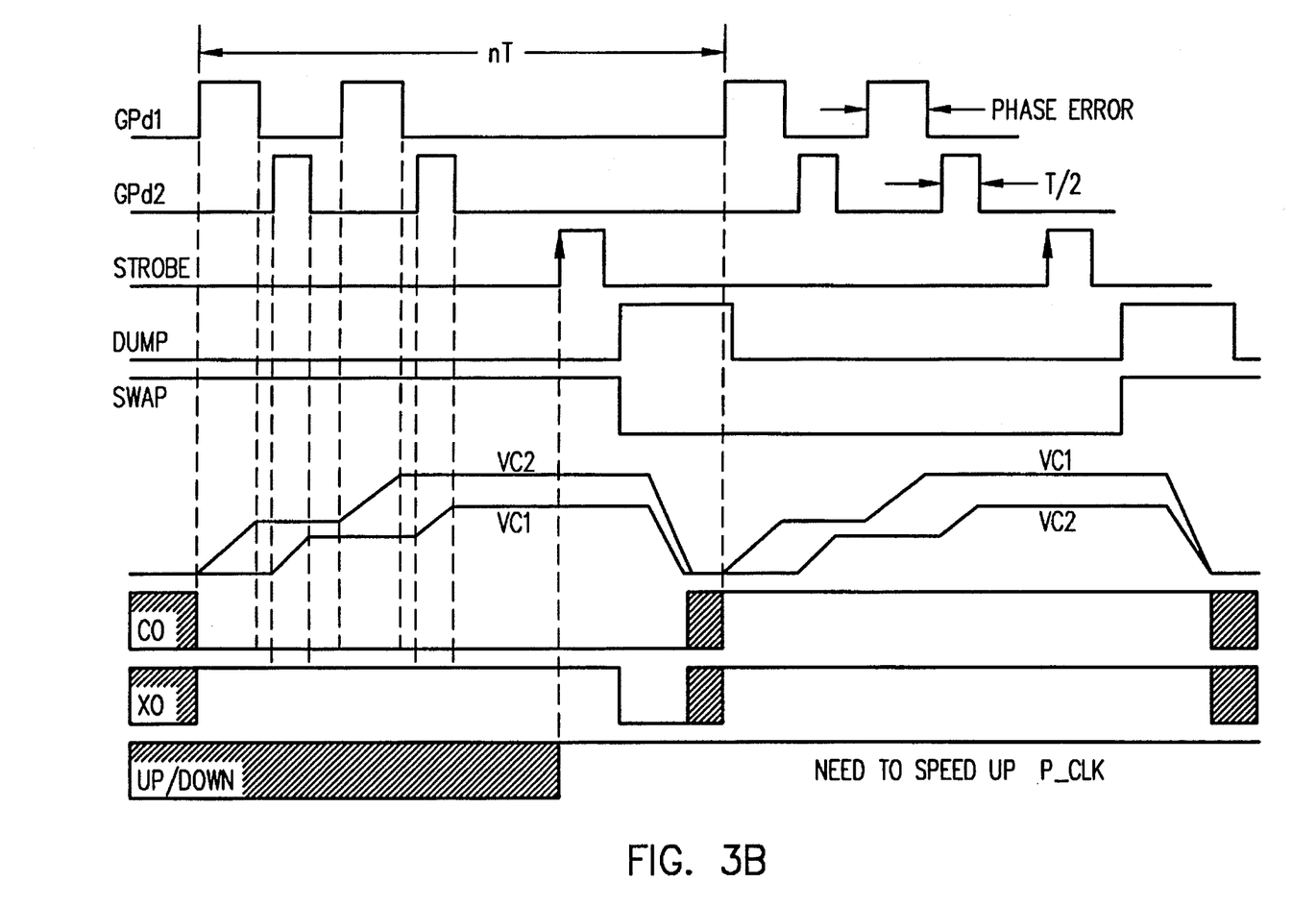
Figure 3C:
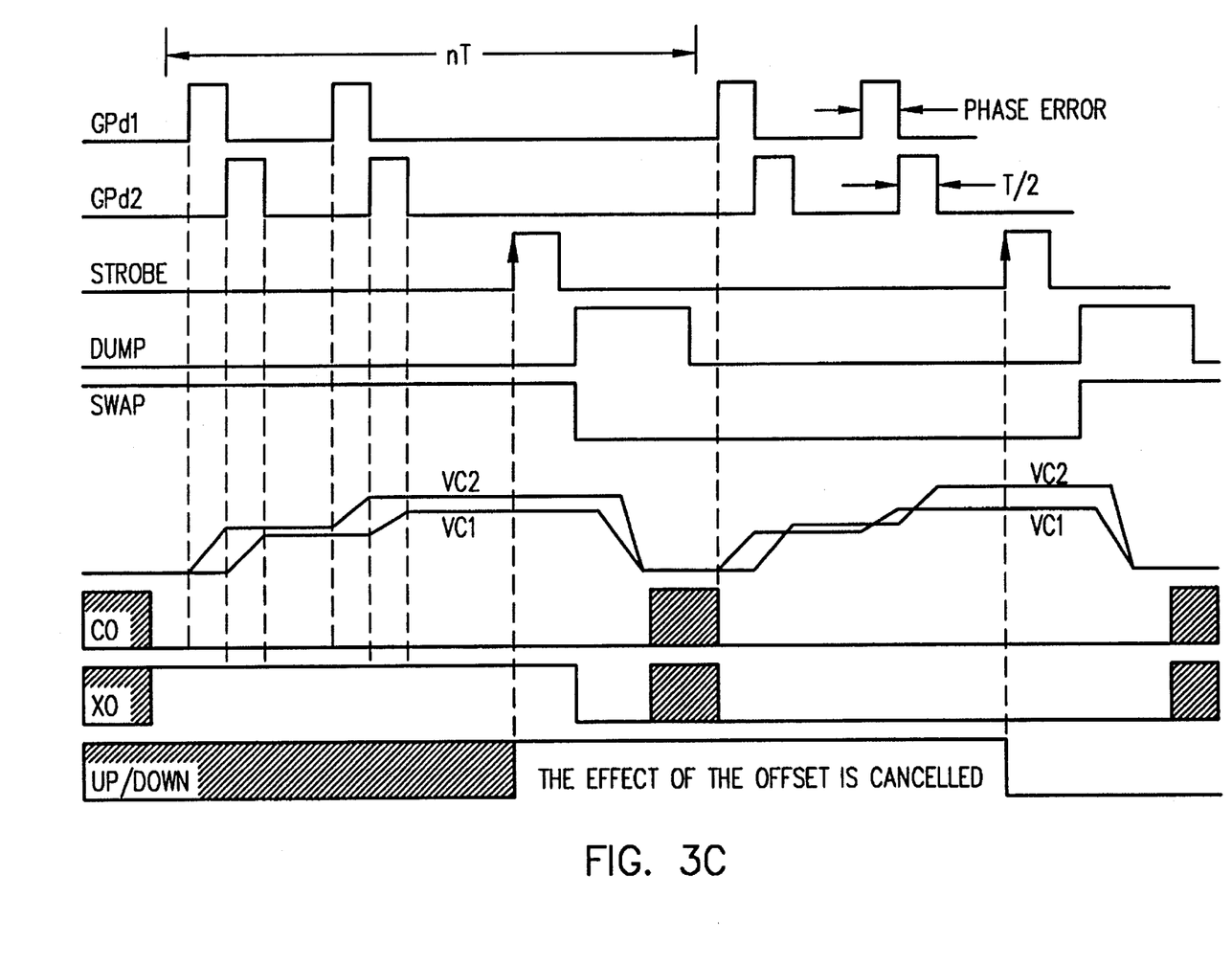

Accordingly, an exclusive-OR gate 144 is provided at the output of comparator 140 to invert the comparator output every other window. Particularly, one input of exclusive-OR gate 144 is coupled to the output of comparator 140. The other input of the exclusive-OR gate 144 is coupled to receive the SWAP signal on line 142. Accordingly, as shown in FIG. 3, exclusive-OR gate 144 has an output signal, XO, which is the same as the comparator output signal, CO, when the SWAP signal is logic low and is the inverse of the comparator output signal, CO, when the SWAP signal is high. Thus, a high output of exclusive-OR gate 144 always indicates a leading phase error and a low output or exclusive-OR gate 144 always indicates a lagging phase error.

The output, XO, of exclusive-OR gate 144 is coupled to the D input of a D flip-flop 146. Finite state machine 136 also generates a STROBE signal 148 which is coupled to the clock input of D flip-flop 146. Finite state machine 136 pulses the STROBE signal 148 near the end of each window in order to cause D flip-flop 146 to latch the outputs, XO, of exclusive-OR gate 144 after the two pulses on each of GPD1 and GPD2 have been processed completely through charge dump circuit 138, comparator 140 and exclusive-OR gate 144. The data is latched responsive to a rising edge of the STROBE pulse.

Finally, finite state machine 136 also generates a DUMP signal 150 which is pulsed high for a short period once during each window. Specifically, it is pulsed high after the STROBE pulse, but before the end of the window, as shown in FIG. 3. DUMP signal 150 is coupled to switches 152A and 152B which, responsive to the DUMP pulse, discharge integrators 138 and 138B, respectively.

The PLL's front end components (phase detector 120 and phase error processor 130) are synchronized to the PLL clock, P-CLK. Other logic blocks, such as the digital loop filter 40 and DCO 110 also are preferably synchronized to P-CLK to prevent any possible start up problems. Thus, the interface between the phase error processor and the digital loop filter is asynchronous.

To prevent any possible meta-stable problems in the asynchronous interface, finite state machine 136 generates a DATA-VALID signal. When the comparator is updating the logic state of the UP/$\overline{\text{DOWN}}$ signal, the DATA-VALID signal is unasserted for three clock periods. The process of disabling DATA-VALID for three clock periods introduces a gain factor of 41/44 in the loop gain calculation.

When there are no edge transitions $D_{in}$, and whenever there is erroneous transmission that reduces the incoming edge density below four data transitions per 44 clock periods, the time slot decoder outputs an unasserted DATA-VALID signal. As a result, no incremental phase error information will be sent to the DCO 110 through the digital loop filter 140. The DCO 110 can stay at its previous frequency until DATA-VALID and UP/$\overline{\text{DOWN}}$ are updated in the next window.

FIGS. 3A–3C are timing diagrams showing various signals, including the SWAP signal, in the phase error processor 130 of the present invention which illustrates how the swapping of the GPD1 and GPD2 signals between the integrators eliminates any SAE that would otherwise be caused by integrator offset and/or comparator input offset.

FIG. 3A illustrates signal conditions when the incoming data is lagging the local clock. FIG. 3B illustrates signal conditions when the incoming data is leading the local clock. FIG. 3C illustrates signal conditions when the data is in phase with the local clock, but there is a 5 mV offset between the integrators due to component mismatch. FIG. 3C most clearly illustrates how the present invention eliminates static alignment error due to integrator offset. As noted, however, the invention also corrects for offset between the comparator inputs.

As shown in FIGS. 3A–3C, at some time between the rising edge of the STROBE signal and the beginning of next window, the SWAP signal switches states. Preferably, the SWAP signal switches states at regular and equal intervals such that the switching occurs at the same relative moment in each window. Thus, for every other window, GPD1 is coupled to integrator 138A and GPD2 is coupled to integrator 138B. In the alternate windows, the connections are reversed such that GPD1 is coupled to integrator 138B and GPD2 is coupled to integrator 138A. Accordingly, any offset between the integrators 138A and 138B and any offset between the comparator inputs is split evenly between GPD1 and GPD2, thus nulling the effect of such offsets. Accordingly, these offsets will result in no static alignment error in the output of comparator 140 and, thus, the UP/$\overline{\text{DOWN}}$ signal.

During each window, two pulses are gated through phase error gating circuit 132 on lines GPD1 and GPD2. Responsive to the pulses on GPD1 and GPD2, the voltages VC1 and VC2 at the outputs of integrators 138A and 138B rise, respectively, as shown in FIG. 3A. As shown, after the last pulse (i.e., the second pulse on and GPD2), VC1 and VC2 remain level. Strobe signal 148 is asserted near the end of the window after the two pulses on each of GPD1 and GPD2 have been processed completely through the charge dump circuit 138, comparator 140 and exclusive-OR gate 44, causing the logic state on exclusive-OR gate signal XO to be latched by D flip-flop 146.

In FIG. 3A, pulse width TW1 of GPD1 is shorter than pulse width TW2 of GPD2, thus causing VC2 to be lower than VC1 at the rising edge of the strobe signal 148. Accordingly, at this instant, the output CO of comparator 144 is logic high. However, because the SWAP signal is logic high during this window, the output XO of exclusive-OR gate 144 is logic low. This indicates a lagging phase error. Thus, D flip-flop 146 latches a logic low output XO and maintains that logic low signal at its output (the UP/$\overline{\text{DOWN}}$ signal) at least until the next rising edge on the STROBE signal.

After the rising edge of the STROBE signal causes the D flip-flop 146 to latch the UP/$\overline{\text{DOWN}}$ signal, integrators 138A and 138B can be reset for integrating the pulses in the next window. Accordingly, DUMP signal 150 is asserted high to discharge the capacitors of the integrators at a time after the rising edge of the STROBE signal but before the end of the window, as shown.

During the next window, the SWAP signal is low and the process is repeated. However, during this window, responsive to the SWAP signal being low, the output XO of exclusive-OR gate 144 is the same as the output CO of comparator 140, rather than the inverse, as was the case in the preceding window. Accordingly, despite the fact that the output CO of the comparator has changed state to low at the rising edge of the STROBE signal, the output XO of the exclusive-OR gate does not switch, but remains low and is latched in that condition, thus still indicating that data is lagging.

In FIG. 3B, the phase error has changed from lagging to leading, i.e., pulse widths TW1 are now wider than pulse widths TW2. Accordingly, the output CO of comparator 140 is low when the STROBE signal is asserted during the first depicted window. Output XO of exclusive-OR gate 144 is high causing the UP/DOWN output signal of D flip-flop 146 to go high upon latching the XO output responsive to the rising edge of the STROBE signal, as shown in FIG. 3B.

Once again, the DUMP signal is asserted before the end of the window causing voltages VC1 and VC2 to return to zero in preparation for integration of the pulses during the next window.

During the next window, there is still a leading phase error such that pulse widths TW1 on GPD1 are still wider than pulse widths TW2 on GPD 2. However, because the SWAP signal has now gone to logic low again, the output CO of comparator 140 is now high, rather than low, even though it is still a leading phase error (as in the previous window). Nevertheless, the output XO of exclusive-OR gate 144 remains high (as in the preceding window) because, during this window, unlike the preceding window, exclusive-OR gate 144 outputs the CO signal. Accordingly, D flip-flop 146 latches another high signal and, therefore, remains high.

FIG. 3C illustrates signal conditions when the data is in phase with the local clock and, therefore, the pulse widths GPD1 and GPD2 are of the same width, but there is a 5 mV offset due to integrator component mismatch. As shown in the first window in FIG. 3C, despite the fact that the pulse widths TW1 and TW2 are equal, VC2 is higher than VC1 due to component mismatch between the integrators. This causes the UP/DOWN signal to go high at the rising edge of the STROBE signal in the first window. However, as shown in the second window, the exact same five millivolt offset error (widths TW1 and TW2 still being equal) now causes the UP/DOWN signal to go low because the integrators have been swapped. Accordingly, when the data is in phase with the local clock, the UP/DOWN signal continuously switches state each window, as should be the case, even though there is a five millivolt offset due to the integrator component mismatch.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

We claim:

1. A phase-locked loop apparatus for generating a local clock signal having a frequency and phase equal to the frequency and phase of a data stream incoming to said phase-locked loop, said apparatus comprising;

an oscillator for generating said local clock signal, said signal having a phase and a frequency, a phase detector coupled to receive said local clock signal and said incoming data stream and generate a first pulse train having pulses of a duration proportional to the phase difference between said local clock signal and said incoming data stream and a second pulse train having reference pulses of a duration equal to the duration of said pulses of said first pulse train when there is no phase difference between said incoming data stream and said local clock signal, and a phase error processor comprising,
      a first integrator having an input terminal and an output terminal,
      a second integrator having an input terminal and an output terminal,
      a comparator having a first input terminal coupled to said output terminal of said first integrator and a second input terminal coupled to said output terminal of said second integrator, and an output terminal for outputting a phase error direction signal, said oscillator being responsive to said phase error direction signal to advance or retard said phase of said local clock signal,
      a switch having first and second conditions, said switch coupled to receive said first and second pulse trains and provide said first pulse train to said first integrator and said second pulse train to said second integrator when in said first condition and provide said second pulse train to said first integrator and said first pulse train to said second integrator when in said second condition, and control means for alternately placing said switch in said first and second conditions at predetermined equal intervals.

2. An apparatus as set forth in claim 1 wherein said control means comprises a finite state machine which generates a SWAP signal which switches between first and second states at said regular intervals, said SWAP signal coupled to a control input terminal of said switch to cause said switch to be in said first condition responsive to said SWAP signal being in said first state and to be in said second condition responsive to said SWAP signal being in said second state.

3. An apparatus as set forth in claim 2 further comprising an exclusive-OR gate having a first input terminal coupled to receive said phase error direction signal and a second input terminal coupled to said SWAP signal and an output terminal, said oscillator being controlled by said output signal of said exclusive-OR gate.

4. An apparatus as set forth in claim 3 further comprising a D flip flop having a data input terminal coupled to said output terminal of said exclusive-OR gate, said D flip flop being controlled to latch a signal at its data input terminal once per interval and having a data output terminal coupled to said oscillator for outputting an UP/DOWN signal, said oscillator being controlled by said UP/DOWN signal to advance the phase of said local clock when in a first state and to retard the phase of said local clock signal when in a second state.

5. An apparatus as set forth in claim 4 further comprising a phase error gating circuit coupled between said phase detector and said switch for receiving said first and second pulse trains and providing a predetermined number of pulses on each of said pulse trains to said switch per each of said predetermined intervals.

6. An apparatus as set forth in claim 5 wherein said predetermined number is two.

7. An apparatus as set forth in claim 6 wherein said control means further generates a STROBE signal which is asserted once per each of said intervals, said D flip flop being controlled to latch said signal at its data input terminal responsive to said assertion of said STROBE signal.

8. An apparatus as set forth in claim 7 wherein said control means further generates a DUMP signal which is coupled to said first and second integrators and is asserted once per each of said intervals after said STROBE signal is asserted, said first and second integrators being responsive to said DUMP signal to reset to a zero state.

9. An apparatus as set forth in claim 8 further comprising a digital loop filter coupled between said phase error processor and said oscillator.

10. A phase error processing circuit for generating a signal indicating whether a phase of a first input signal lags or leads the phase of a second input signal, said circuit comprising;

a first integrator having an input terminal and an output terminal, a second integrator having an input terminal and an output terminal, a comparator having a first input terminal coupled to said output terminal of said first integrator and a second input terminal coupled to said output terminal of said second integrator, and an output terminal for outputting a phase error direction signal, a switch having first and second conditions, said switch coupled to receive first and second pulse trains and provide said first pulse train to said first integrator and said second pulse train to said second integrator when in said first condition and provide said second pulse train to said first integrator and said first pulse train to said second integrator when in said second condition, said first pulse train having pulses of a duration proportional to the phase difference between said first and second input signals and said second pulse train having reference pulses of a duration equal to the duration of said pulses of said first pulse train when there is no phase difference between said first and second input signals, and control means for alternately placing said switch in said first and second conditions at predetermined equal intervals.

11. A circuit as set forth in claim 10 wherein said control means comprises a finite state machine which generates a SWAP signal which switches between first and second states at said predetermined intervals, said SWAP signal coupled to a control input terminal of said switch to cause said switch to be in said first condition responsive to said SWAP signal being in said first state and to be in said second condition responsive to said SWAP signal being in said second state.

12. A circuit as set forth in claim 11 further comprising an exclusive-OR gate having a first input terminal coupled to receive said phase error direction signal and a second input terminal coupled to said SWAP signal and an output terminal so as to invert said output of said comparator in alternate ones of said predetermined intervals.

13. An apparatus as set forth in claim 12 further comprising a D flip flop having a data input terminal coupled to said output terminal of said exclusive-OR gate, said D flip flop being controlled to latch a signal at its data input terminal once per predetermined interval and having a data output terminal for outputting an UP/$\overline{\text{DOWN}}$ signal.

14. An apparatus as set forth in claim 13 further comprising a phase error gating circuit coupled before said switch for receiving said first and second pulse trains and providing a predetermined number of pulses on each of said pulse trains to said switch per each of said predetermined intervals.

15. An apparatus as set forth in claim 14 wherein said predetermined number is two.

16. An apparatus as set forth in claim 15 wherein said control means further generates a STROBE signal which is asserted once per each of said intervals, said D flip flop being controlled to latch said signal at its data input terminal responsive to said assertion of said STROBE signal.

17. An apparatus as set forth in claim 16 wherein said control means further generates a DUMP signal which is coupled to said first and second integrators and is asserted once per each of said intervals after said STROBE signal is asserted, said first and second integrators being responsive to said DUMP signal to reset to a zero state.

18. A phase-locked loop apparatus for generating a local clock signal having a frequency and phase equal to the frequency and phase of a data stream incoming to said phase-locked loop, said apparatus comprising;

an oscillator for generating said local clock signal, said signal having a phase and a frequency, a phase detector coupled to receive said local clock signal and said incoming data stream and generate a first pulse train having pulses of a duration proportional to the phase difference between said local clock signal and said incoming data stream and a second pulse train having reference pulses of a duration equal to the pulse width of said pulses of said first pulse train when there is no phase difference between said incoming data stream and said local clock signal, and a phase error processor comprising, a first integrator having an input terminal and an output terminal, a second integrator having an input terminal and an output terminal, a comparator having a first input terminal coupled to said output terminal of said first integrator and a second input terminal coupled to said output terminal of said second integrator, and an output terminal for outputting a phase error direction signal, said oscillator being responsive to said phase error direction signal to advance or retard said phase of said local clock signal, a switch having first and second conditions, said switch coupled to receive said first and second pulse trains and provide said first pulse train to said first integrator and said second pulse train to said second integrator when in said first condition and provide said second pulse train to said first integrator and said first pulse train to said second integrator when in said second condition, an exclusive-OR gate having a first input terminal coupled to receive said phase error direction signal and a second input terminal and an output terminal, said oscillator being controlled by said output signal of said exclusive-OR gate, a D flip flop having a data input terminal coupled to said output terminal of said exclusive-OR gate, and having a data output terminal coupled to said oscillator for outputting an UP/$\overline{\text{DOWN}}$ signal, said oscillator being controlled by said UP/$\overline{\text{DOWN}}$ signal to advance the phase of said local clock when in a first state and to retard the phase of said local clock signal when in a second state, a finite state machine which generates a SWAP signal which switches between first and second states at said predetermined intervals, said SWAP signal coupled to a control input terminal of said switch to cause said switch to be in said first condition responsive to said SWAP signal being in said first state and to be in said second condition responsive to said SWAP signal being in said second state and further coupled to said second input terminal of said exclusive-OR gate to cause said exclusive-OR gate to invert said phase error direction signal when in said first state and to pass said phase error direction signal when in said second state, said finite state machine further generating a STROBE signal which is asserted once per each of said intervals, said D flip flop being controlled to latch said signal at its data input terminal responsive to said assertion of said STROBE signal and a DUMP signal which is coupled to said first and second integrators and is asserted once per each of said intervals after said STROBE signal is asserted, said first and second integrators being responsive to said DUMP signal to reset to a zero state, and a digital loop filter coupled between said phase error processor and said oscillator.

19. An apparatus as set forth in claim 18 further comprising a phase error gating circuit coupled between said phase detector and said switch for receiving said first and second pulse trains and providing a predetermined number of pulses on each of said pulse trains to said switch per each of said predetermined intervals.

20. A method of generating a local clock signal having a frequency and a phase equal to a frequency and a phase, respectively, of an incoming data stream, said method comprising the steps of;

(1) generating a local clock signal, (2) receiving said incoming data stream, (3) generating a first pulse train comprising first pulses of a duration proportional to the phase difference between said local clock signal and said incoming data stream and a second pulse train having reference pulses of a duration equal to the duration of said pulses of said first pulse train when there is no phase difference between said incoming data stream and said local clock signal, (4) providing said first pulse train to a first integrator during a first time window and to a second integrator during a second time window of duration equal to said first time window, (5) providing said second pulse train to said second integrator during said first time window and to said first integrator during said second time window, (6) generating a control signal each window responsive to said integrators which is in a first state when said integrators indicate that said reference pulses are of a greater duration than said first pulses and in a second state when said integrators indicate that said reference pulses are of a lesser duration than said phase data pulses, and (7) advancing the phase of said local clock signal responsive to said control signal being in said first state and retarding the phase of said local clock signal responsive to said control signal being in said second condition.

21. A method as set forth in claim 20 wherein said first and second time windows each comprise a plurality of time windows, said first and second time windows being interleaved such that said first and second integrators alternately integrate said first second pulse trains during alternate windows.

22. A method as set forth in claim 21 wherein step (6) comprises the steps of;

(6.1) comparing the output of said first integrator with the output of said second integrator and generating a compare signal which is in a first state if the output of said first integrator is greater than the output of said second integrator and is in a second condition if the output of said first integrator is less than the output of said second integrator, and (6.2) inverting the compare signal during said second time windows.

23. A method as set forth in claim 22 wherein step (6) further comprises the step of;

(6.3) latching the inverted compare signal once per window at an instant after the first pulses and the reference pulses associated with that window have occurred to generate said control signal.

24. A method as set forth in claim 20 wherein step (5) comprises the step of;

(5.1) providing said first and second pulse trains each to a switch, and (5.2) alternately switching said switches so as to couple said first pulse train to said first integrator and said second pulse train to said second integrator during said first time windows and to couple said first pulse train to said second integrator and said second pulse train to said first integrator during said second time windows.

25. A method as set forth in claim 20 further comprising the step of;

(2.5) providing only a predetermined number of pulses on said pulse trains to said switches during each of said time windows.

26. A method as set forth in claim 25 wherein said predetermined number is two.

27. A method as set forth in claim 20 further comprising the step of;

(8) discharging said integrators each window after said inverted comparator output signal is latched.

\* \* \* \* \*